United States Patent
Wolff

(10) Patent No.: US 7,026,255 B2
(45) Date of Patent: Apr. 11, 2006

(54) METHOD AND DEVICE FOR PHOTO-ELECTROCHEMICALLY ETCHING A SEMICONDUCTOR SAMPLE, ESPECIALLY GALLIUM NITRIDE

(76) Inventor: Thomas Wolff, Bregstrasse 90, 78120 Furtwangen (DE)

(*) Notice: Subject to any disclaimer, the term of this patent is extended or adjusted under 35 U.S.C. 154(b) by 207 days.

(21) Appl. No.: 10/693,771

(22) Filed: Oct. 24, 2003

(65) Prior Publication Data

US 2004/0110386 A1   Jun. 10, 2004

(30) Foreign Application Priority Data

Dec. 4, 2002   (DE) ................. 102 56 821

(51) Int. Cl.
 *H01L 21/302* (2006.01)
(52) U.S. Cl. ............ 438/746; 438/747; 438/750; 438/753; 216/84; 216/85; 216/93; 216/94; 216/96; 205/640; 205/645; 205/655; 205/674
(58) Field of Classification Search ............ None
See application file for complete search history.

(56) References Cited

U.S. PATENT DOCUMENTS

| | | | |
|---|---|---|---|
| 5,338,416 A * | 8/1994 | Mlcak et al. ........ | 205/643 |
| 5,773,369 A * | 6/1998 | Hu et al. ........... | 438/746 |
| 5,895,223 A * | 4/1999 | Peng et al. ......... | 438/18 |
| 6,127,280 A * | 10/2000 | Stutz ............... | 438/746 |
| 6,884,740 B1 * | 4/2005 | Hu et al. ........... | 438/708 |

FOREIGN PATENT DOCUMENTS

| | | |
|---|---|---|
| DE | 41 26 916 A1 | 2/1993 |
| DE | 195 10 852 A1 | 9/1995 |

OTHER PUBLICATIONS

Notten et al., Etching of III-V Semiconductors, 1991, Elsevier Science Publishers, pp. 43-45.*
Adesida et al.: "Dry and Wet Etching for Group III-Nitrides", 1999.
Youtsey et al.: "Smooth n-type GaN surfaces by photoenhanced wet etching", 1998.
Notten et al.: "Etching of III-V Semiconductors", 1991.

* cited by examiner

*Primary Examiner*—Nadine G. Norton
*Assistant Examiner*—Eric B. Chen
(74) *Attorney, Agent, or Firm*—Henry M. Feiereisen

(57) ABSTRACT

In a method for photo-electrochemical etching of a semiconductor sample, the semiconductor sample is brought in contact with an electrolyte liquid. The contact area formed thereby is illuminated through the electrolyte liquid with UV light. The photo-current created by UV light irradiation at the contact area is measured. To increase the etching quality, a jet of fresh electrolyte liquid is repeatedly applied to the contact area. A device for carrying out the method includes a container to be filled with an electrolyte liquid, a UV source for illuminating the semiconductor sample with UV light through the electrolyte liquid, and a measuring instrument for measuring the photo-current created during UV light irradiation of the contact area. Further provided are an inlet for supplying fresh electrolyte liquid, directed towards the semiconductor sample, and a device attached to the inlet for repeated production of electrolyte fluid jets, directed towards the semiconductor sample.

12 Claims, 2 Drawing Sheets

METHOD AND DEVICE FOR PHOTO-ELECTROCHEMICALLY ETCHING A SEMICONDUCTOR SAMPLE, ESPECIALLY GALLIUM NITRIDE

CROSS-REFERENCES TO RELATED APPLICATIONS

This application claims the priority of German Patent Application, Ser. No. 102 56 821.9, filed Dec. 4, 2002, pursuant to 35 U.S.C. 119(a)–(d), the disclosure of which is incorporated herein by reference.

FIELD OF THE INVENTION

The invention relates to a method for photo-electrochemically etching a semiconductor sample, in particular a semiconductor sample of gallium nitride, wherein the semiconductor sample is brought in contact with an electrolyte liquid, wherein the contact area of the semiconductor sample formed thereby is illuminated through the electrolyte liquid with ultraviolet (UV) light, and wherein the resulting photo-current is measured.

The invention further relates to a process for photo-electrochemically etching a semiconductor sample, preferably a gallium nitride sample, comprising a container for receiving an electrolyte liquid, a UV light source for illuminating the semiconductor sample with UV light through the electrolyte liquid, and a measuring device for the measurement of the photo-current generated by irradiating the contact area between the semiconductor and the electrolyte with UV light.

BACKGROUND OF THE INVENTION

The semiconductor sample considered here has the form of a disk. This can be a so-called wafer or a part thereof. Preferably it concerns a sample, which is coated with gallium nitride at its top side. The top side, however, may also comprise other semiconductor materials, like silicon, germanium, gallium arsenide, indium phosphide or other compositions containing elements of the $3^{rd}$ and $5^{th}$ period of the periodic table of the elements, i. e. so-called III-V-semiconductors.

Gallium nitride has lately attained a steadily increasing importance: With this material it is possible to fabricate opto-electronic devices, such as light emitting diodes (LEDs) and diode lasers with blue radiation emission, electronic high frequency elements, electronic elements to operate at very high operating temperatures and interesting micro-mechanical devices. In contrast to other III-V-semiconductors, e.g. gallium arsenide, gallium nitride is very stable against wet-chemical procedures usually used in semiconductor manufacturing. Photo-electrochemical etching is an important process step for the measurement of the doping profile of a semiconductor. Measurement of the doping profile uses the fact, that the interface between the electrolyte and the semiconductor surface forms a Schottky contact. The Schottky contact permits etching of the semiconductor, if a voltage is applied to the interface in forward direction, or if the interface is illuminated with light. The Schottky contact also permits to measure the carrier concentration (doping) of the semiconductor, if the capacity of the interface is measured at various voltages in reverse direction. Therefore, the doping profile of the semiconductor sample can be determined by alternating etching and measuring steps. Also in manufacturing steps for the production of gallium nitride devices photo-electrochemical etching can be an important process step.

A procedure and an equipment of the kind initially specified are known from the articles "Dry and Wet Etching for Group III-Nitrides" (I. Adesida, C. Youtsey, A. T. Ping, F. Khan, L. T. Romano, G. Bulman; MRS Internet J. Nitride Semiconductor Res. 4S1, G1.4 (1999), in particular FIG. 4) and "Smooth n-type GaN surfaces by photoenhanced wet etching" (C. Youtsey, I. Adesida; Applied Physics Letters, Vol. 72 (1998), p. 560–562). A semiconductor sample of negatively doped gallium nitride on a Teflon plate is positioned horizontally in a container. The container is filled with aqueous diluted caustic potash solution (KOH), and the semiconductor sample is illuminated with UV light from the top. As known from the electrochemistry of electrolyte semiconductor interfaces, the contact area between the semiconductor sample of negatively doped gallium nitride and the diluted caustic potash solution (KOH) form a Schottky contact. If this contact area is irradiated with light of sufficiently high energy, in the semiconductor sample directly underneath the contact area electron-hole-pairs are generated. This will lead to a photo-current, if an electric circuit between the electrolyte liquid and the semiconductor sample is closed. The electrons move from the contact area to the electric contact via the negatively doped semiconductor sample. The holes can release electrons of the semiconductor atoms at the semiconductor surface, and thus the semiconductor surface may be etched. This etching of the semiconductor material may be supervised by measuring the photo-current; it is called photo-electro-chemical etching of the semiconductor.

For the well-known equipment cited above it is to be regarded as unfavorable that always the entire semiconductor sample comes into contact with the electrolyte liquid, and that generally it is not possible to etch locally a limited range of the semiconductor sample for local measurements. If semiconductor materials, such as e. g. gallium nitride, are etched, gas bubbles develop at the contact area. These gas bubbles rise towards the incident UV light in an upward direction, what disturbs an even irradiation of the sample with light. Solid residues from the etching procedure may remain lying on the contact area. They also disturb the incident light irradiation and the further etching procedure. Also traces of gas bubbles may possibly be visible after the etching procedure on the surface structure of the semiconductor sample, because the gas bubbles increase slowly, before they separate from the surface and rise. So this procedure does not produce reproducibly clean and smooth surfaces, seen on a macroscopic scale.

From the book "Etching of III-V-Semiconductors" (P. H. L. Notten, J. E. A. M. van den Meerakker, J. J. Kelly; Elsevier Science Publishers Ltd. 1991, ISBN 0-946395-84-5, pages 43 to 46, in particular FIG. 3,4 on page 44) it is well-known, that it is an advantage to supply fresh electrolyte liquid to the contact area during the photo-electrochemical etching of a semiconductor sample. In this equipment the semiconductor sample is mounted horizontally on a plate. This plate simultaneously forms the bottom of the electrolyte container. The top of the electrolyte container consists of glass. The top contains a window, through which light can be conducted to the contact area using a light conductor. The top of the electrolyte container also contains an inlet for fresh electrolyte liquid and an outlet for the liquid. The inlet is implemented in such a way that electrolyte liquid flows over the contact area in a laminar flow without developing turbulences. This is meant to assure that during the entire etching procedure fresh electrolyte liquid may flow, without disturbing the light irradiation of the contact area by any turbulences of the liquid. In the description of FIG. 4 it is noted that a measuring instrument can be attached to the outlet to analyse the liquid after contact with the contact area.

This equipment has the disadvantage that the constant supply of electrolyte liquid leads to a relatively high consumption of electrolyte liquid. In addition this equipment is just an experimental device; it merely serves scientific investigations of the etching process. It has further disadvantages, which have been mentioned already with the first well-known procedure above, and is was not planned to be used with samples made of gallium nitride.

It would be desirable and advantageous to provide an improved method for etching of a semiconductor sample, in particular of gallium nitride, to obviate prior art shortcomings It would also be desirable and advantageous to provide an improved device for etching of a semiconductor sample with better etching results, when etching over a longer time is involved.

SUMMARY OF THE INVENTION

According to one aspect of the present invention, in a method for photo-electrochemically etching a semiconductor sample, preferably made of gallium nitride, the semiconductor sample is brought in contact with an electrolyte liquid, thereby forming a contact area, the contact area of the semiconductor sample is irradiated through the electrolyte liquid with UV light, thereby generating a photo current, the photo current is measured, and a jet of fresh electrolyte liquid is repeatedly applied to the contact area, preferably in form of a pressure surge.

It has proven to be particularly favourable to illuminate the contact area repeatedly for a given time with the UV light and to apply the fluid jet to the contact area in the waiting period between two UV light irradiations. The given time for the UV irradiation may be between 5 and 20 seconds, preferably. 10 seconds, and the waiting period, during which the UV light irradiation is switched off, may be between 1 and 10 seconds, preferably 2 seconds. The fluid jet may be applied using a pump, preferably in form of a pressure surge. Practical investigations have shown that it is sufficient, if the fluid jet is applied during a time of 0.1 to 2.0 seconds, preferably during approximately 0.3 seconds.

In accordance with another feature of the invention, the electrolyte fluid jet may be applied at the beginning of the waiting period between two UV light irradiations, preferably immediately after the end of the preceding UV light irradiation.

Suitably, the semiconductor sample is kept replaceable in a vertical position. In this way, particles of dirt that may exist in the electrolyte move downwards, and gas bubbles that may be generated during the etching procedure move upwards. Thus the contact area can be kept clean more easily.

If the semiconductor sample is etched locally for a local measurement of the dopant concentration, it is an advantage to define the contact area versus the electrolyte by providing a sealing ring. The inner diameter of this sealing ring should have a value between 1 to 4 mm. It is of advantage, if this sealing ring is available in two sizes and if it is easily exchangeable, so that e.g. measurements with a measuring surface of 0,1 $cm^2$ or with a measuring surface of 0,01 $cm^2$ are feasible. The sealing ring has then an inside diameter of 3,57 mm or 1,13 mm, respectively.

A voltage of −0.5 V to +0,5 V should be applied between the semiconductor sample and a reference electrode. As the electrolyte liquid an aqueous diluted caustic potash solution (KOH) solution with a concentration in the range of 0,002M to 0,1M, preferably of 0,01M, may be used.

According to another aspect of the present invention, a device for photo-electrochemically etching a semiconductor sample, preferably made of gallium nitride, includes a container to be filled with an electrolyte liquid, a UV light source for illuminating said semiconductor sample with UV light through said electrolyte liquid, a measuring unit for measuring a photo-current that is generated When the contact area is illuminated with said UV light, an inlet for supplying fresh electrolyte liquid, wherein the inlet is directed towards said semiconductor sample, and an apparatus connected to the inlet for repeatedly creating electrolyte liquid jets, which are directed towards the semiconductor sample, preferably in form of a pressure surge.

The apparatus for the repeated production of the electrolyte fluid jets may contain a peristaltic pump, to which a tank for fresh electrolyte liquid is connected.

In order to keep the contact area clean during the etching procedure, the semiconductor sample is preferably held vertically. For routine investigations it is favourable, if the semiconductor sample is easily replaceable, and if—for the purpose of holding the semiconductor sample—a vacuum fixture is attached. In another embodiment the plate holding the semiconductor sample may be attachable to the fluid container from the outside thereof, preferably at a vertical side wall of the container. For the handling it has turned out to be favourable, if the sample retaining plate is fixed, and if the fluid container is movable in the direction of the retaining plate holding the semiconductor sample.

It is of particular advantage, if the fluid container has an aperture in the wall pointing to the plate holding the semiconductor. This aperture should contain a sealing ring, preferably made from a flexible synthetic material. The sealing ring and the semiconductor sample must be brought in contact with one another in such a way, that when filling the container with electrolyte liquid, no liquid exits from the edge of the contact area, and that the entire contact area can be illuminated with UV light.

According to another feature of the present invention, a window translucent for UV light may be inserted in a wall of the fluid container, which faces the aperture with the sealing ring,.

According to another feature of the present invention, the container may be made of a synthetic material such as Teflon (PTFE). In order to protect a sealing ring having a very fine sealing lid against injury, it is very meaningful that for the movement of the container in the direction of the plate holding the semiconductor a linear stage is provided, which presses the sealing ring only up to a given maximum pressure strength against the semiconductor sample. This strength should be adjustable in the range 50–300 cN, e.g. by a spring mechanism.

According to another feature of the present invention, at least one current electrode and at least one voltage electrode may be provided for contacting the semiconductor sample, and a further current electrode and a further voltage electrode as well as a reference electrode ending within the electrolyte liquid, e.g. a standard calomel electrode, may be provided in the container. The reference electrode should not disturb the illumination of the contact area by light. For the further current electrode and the further voltage electrode a wire made of platinum may preferably be used.

The inlet for the electrolyte liquid may be implemented as a pipe made from a synthetic material, preferably from Teflon (PTFE). It may have an inside diameter between 0,6 and 2 mm, preferably of 1 mm. The angle, under which the inlet is directed against the surface-normal of the applied semiconductor sample, can amount to 10 to 45°, preferably to 30°.

By using a valve mechanism connected to the inlet for the electrolyte liquid, a reservoir for a cleaning fluid, e.g. water ($H_2O$), and a gas bottle for a gas suitable for drying. e.g. nitrogen ($N_2$), may be attached. In this way the electrolyte area and the contact area may easily be cleaned and dried.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
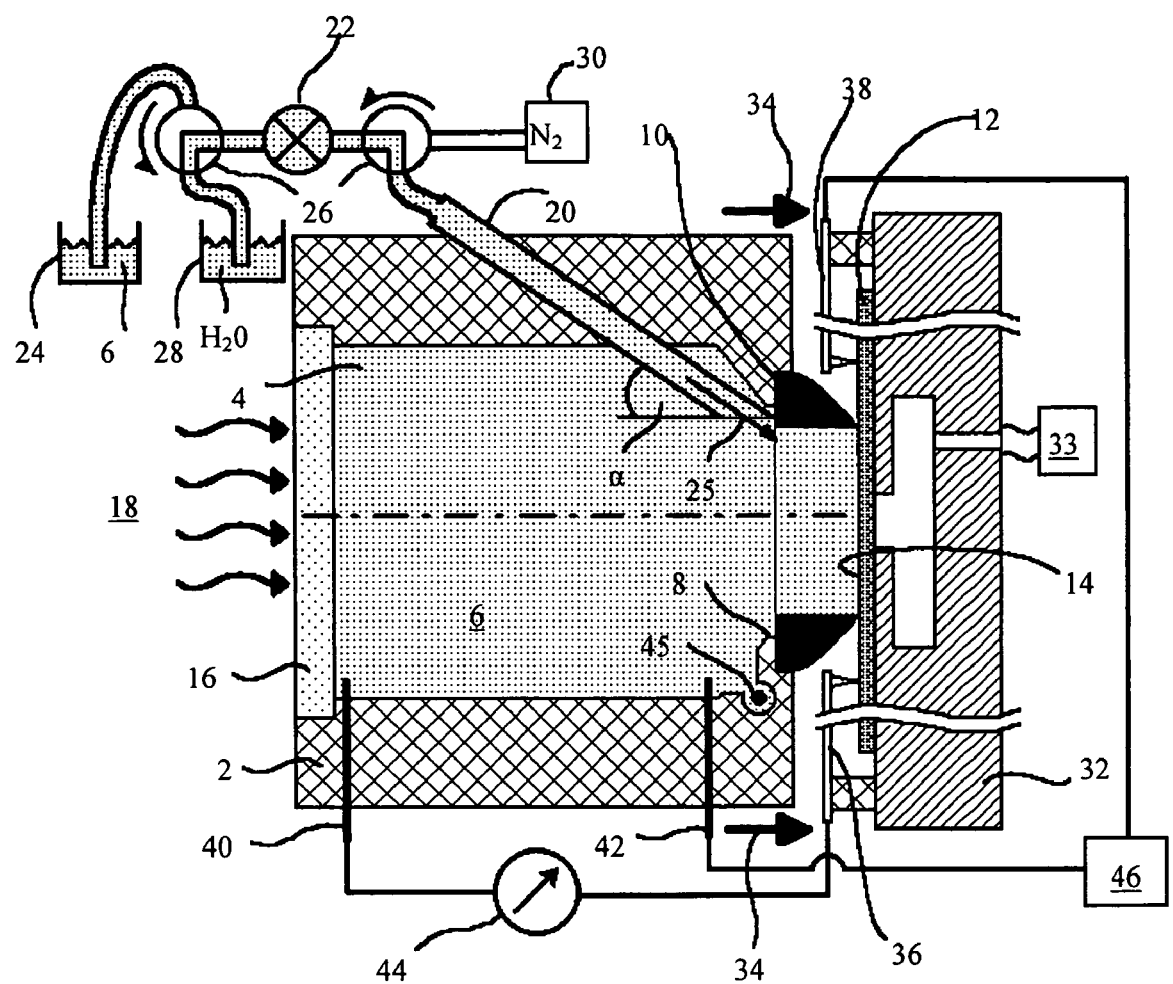
FIG. 1 shows from above a cross section of an electrolyte cell incorporating a device for photo-electrochemically etching according to the invention.

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a cylindrical electrolyte space 4 which is centrally arranged in an essentially rectangular body or container 2 made of a synthetic material, e.g. made of Teflon (PTFE). During operation the electrolyte space 4 contains an electrolyte liquid 6, e.g. an aqueous diluted caustic potash solution (KOH) with a concentration of 0.01M. The electrolyte space 4 is narrowing conically towards the right side of the container 2 in FIG. 1, and it ends at the right vertical side wall in a round aperture 8, to which a round sealing ring 10 of a flexible synthetic material is fixed from the outside. If the sealing ring 10 is attached to a semiconductor sample 12, here preferably a gallium nitride sample, which is aligned vertically, then the electrolyte space 4 is closed to the right in a liquid tight manner. The sealing ring 10 defines or limits a contact area 14 on the semiconductor sample 12. The sealing ring 10 is mounted or installed replaceable by means of a sliding fixture plate (not shown). A ring 10 can be used with an inside diameter of 3.57 mm or 1.13 mm, depending upon the measuring task. This is also the diameter of the contact area 14, at which the etching procedure proceeds. The contact area 14 has then a size of 0.1 $cm^2$ or 0.01 $cm^2$, respectively. The ring 10 has a very fine lid towards the semiconductor sample 12, so that this contact area 14 is defined precisely.

To the left the electrolyte space 4 is closed by a window 16 made of sapphire, which is permeable for ultraviolet (UV) light. From a source of UV light (not shown) UV light 18 as parallel as possible is irradiated through this vertically arranged window 16 and through the electrolyte space 4 onto the contact area 14. As source of UV light e.g. a 100W-Tungsten high pressure lamp can be used. The UV light 18 of the source of light can be made parallel by a lens system (not shown), which consists e.g. of two lenses of fused silica. The intensity of the UV light 18 can then be varied by modifying the position of one of these lenses. Using a shutter (not shown), the irradiation of the contact area 14 with UV light 18 can be switched on and off.

Figure 3:
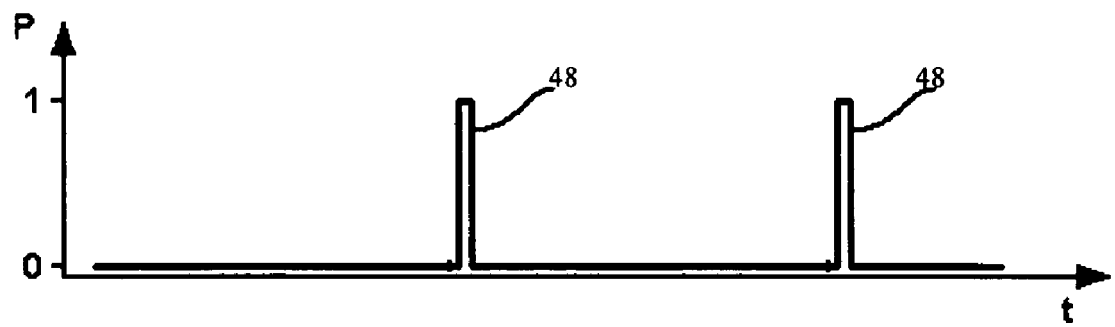
FIG. 3 shows a typical course for the supply of fresh electrolyte liquid to the contact area in the form of pressure surges (P=Status of the pump, 0=Off, 1=On)

Forming an angle of approx. 30° against the surface-normal of the contact area 14 an inlet 20 for providing fresh electrolyte is inserted in the wall of the container 2, which wall is shown on the top of FIG. 1. This inlet 20 for fresh electrolyte liquid 6 is directed in such a way toward the contact area 14, that the fresh electrolyte liquid 6 may be applied to the contact area 14 with a pump 22, e.g. in form of a peristaltic pump, from a tank 24. The inlet 20 is a pipe made of a synthetic material, typically of Teflon (PTFE). It has an inside diameter of 1 mm. The inlet 20 is machined in such a way at its point directing to the contact area 14 that it does not obstruct the parallel rays of UV light 18. So the supplied electrolyte liquid 6 contacts the contact area 14 as directly as possible. The inlet 20 ends directly at the sealing ring 10, so that the inlet 20 is held in position, if electrolyte liquid 6 is supplied in form of a pressure surge. Using the pump 22 the electrolyte space 4 can be filled with electrolyte liquid 6. It is also possible to supply additional fresh electrolyte liquid 6 to the contact area 14 in form of jets 25 during the etching process in certain time intervals (FIG. 3).

In the bottom wall of the container 2 a drain valve is provided (not shown), via which the liquid 6 from the electrolyte space 4 can be discharged.

Using a valve device 26, alternatively also cleaning liquid, e.g. deionized water ($H_2O$) from a reservoir 28, or nitrogen ($N_2$) from a gas bottle 30 can be conducted into the electrolyte space 4. So it is possible to clean and dry the contact area 14 and the electrolyte space 4. At the top side of the electrolyte space 4 an overflow chamber follows (not shown). From this overflow chamber an overflow pipe (not shown) having a pressure balance opening (not shown) exits, so that surplus electrolyte or cleaning fluid may flow off from there.

At the right side of the container 2 the semiconductor sample 12 is held vertically and replaceable on a spatially fixed plate 32 made of a metal or synthetic material. The plate 32 can be moved into a horizontal position for simple exchanges of the semiconductor sample 12; it is attached to a vacuum or sucking device 33, so that the semiconductor sample 12 is attached in a safe way. By means of a drive or slide stage 34, symbolized by two arrows, the container 2 can be moved against the semiconductor sample 12 in such a way, that the sealing ring 10 touches the semiconductor sample 12 and is pressed against it. This drive or slide stage 34 may consist e.g. of two low-friction linear stages, which are arranged underneath the container 2, one stage on the other stage, and both stages parallel to each other. The upper part of the upper linear stage is fixed to the container 2, whereas the lower part of the lower linear stage is fixed to a fixed base plate. If the sealing ring 10 is to be driven against the semiconductor sample 12, the lower linear stage is driven. The upper part of the lower stage is fixed to the lower part of the upper stage, and this center section of the two stages is connected with the upper section of the upper stage by a tension spring. This tension spring is stretched, as soon as the sealing ring 10 touches the semiconductor sample 12. If the sealing ring 10 is to be driven against the semiconductor sample 12, the lower linear stage is driven until the tension spring is elongated to a predefined length. So the force to press the sealing ring 10 against the semiconductor 12 may be specified by an adjustable end switch for the tension spring. This force is independent of the thickness of the semiconductor sample 12, because the spring starts to elongate only after the ring 10 has touched the semiconductor sample 12. By means of the drive or slide stage 34, the sealing ring 10 may be pressed to the semiconductor sample 12 with a given maximum force, which is adjustable in the range from 50 to 300 cN.

A current electrode 36 and a voltage electrode 38 are used to contact the semiconductor sample 12 at its surface side. These electrodes 36, 38 comprise tinned contact tips, which are fixed to the end or point of a lever made of steel in each case. A further current electrode 40 and a further voltage electrode 42 are fixed in the container 2. The further voltage electrode 42 is mounted in the electrolyte space 4 as near as possible to the contact area 14. It is designed as a circularly curved platinum wire bound concentrically around the axis of the sealing ring 10. Thus, using this electrode the voltage potential at the circular contact area 14 may be adjusted homogeneously. The further current electrode 40 is implemented also as a platinum wire, but it is placed inside the electrolyte area 4 as far as possible away of the sealing ring 10. Thus, the current distribution throughout the electrolyte space 4 up to the sealing ring 10 is as uniform as possible. Additionally any gas bubbles, that may be created at the further current electrode 40, rise into the overflow chamber (not shown) at a point which is far away from the sealing ring 10.

By means of a measuring instrument 44 the photo-current I can be measured, that is created by irradiating the contact area 14 with UV light 18. This measuring instrument 44 measures the current between the current electrode 36 and the further current electrode 40. To adjust the DC voltage at the contact area 14, a reference electrode 45, for instance a standard calomel electrode, or a standard AgCl electrode containing no mercury, is mounted in the container 2. The electrode 45 ends in such a way in the proximity of the sealing ring 10 that it does not obstruct the irradiation with UV light 18. Using a measuring instrument 46, known as potentiostat, the voltage between the voltage electrode 38 and the further voltage electrode 42 can be adjusted in such a way that between the reference electrode 45 and the voltage electrode 38 of the semiconductor sample 12 a voltage of typically 0V results.

Figure 2:
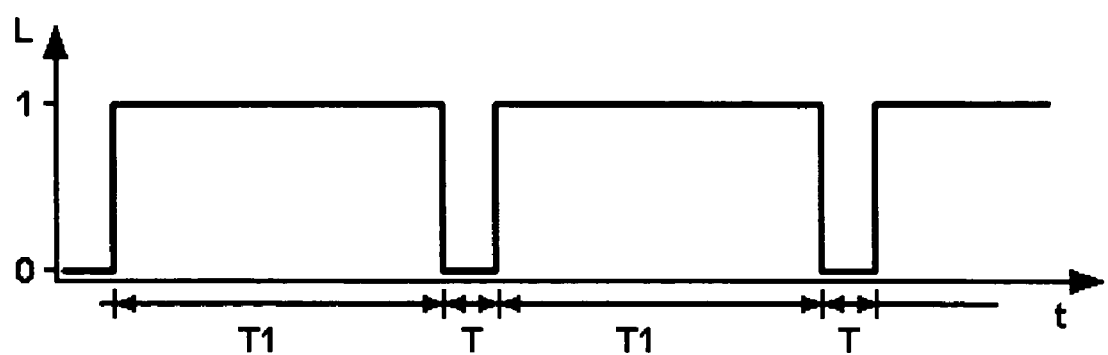
FIG. 2 shows a typical course (ON/OFF) for the irradiation of the contact area with UV light (L=Status of the light source, 0=Off, 1=On)
Figure 4:
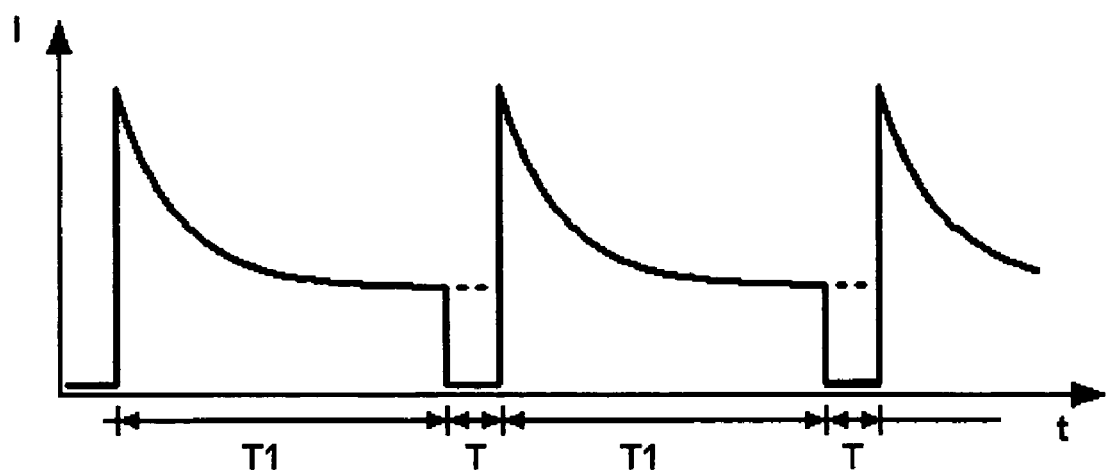
FIG. 4 shows a typical course of the resulting photocurrent I measured with a measuring instrument.

FIGS. 2 to 4 illustrate how the equipment described above can be used to etch the semiconductor sample 12. In the following description it is assumed that the semiconductor sample 12 consists of gallium nitride and that as electrolyte liquid 6 a strongly diluted caustic potash solution (KOH) having a concentration of e.g. 0.01M is used. FIG. 4 shows how the current I rises when switching on the irradiation (see FIG. 2) of the contact area 14 with light. It rises very steeply. Subsequently it decreases slowly.

From the electrochemistry of the semiconductor-electrolyte-interface of gallium arsenide the following mechanism of the photo-electrochemical etching process is well-known in an alkaline solution: The semiconductor material 12 is oxidized electro-chemically, and the oxide is dissolved chemically, so that in an equilibrium between these two reactions always an oxide coating consisting of only a few molecular layers is present. The solubility of the oxide is essentially determined by the pH value of the electrolyte liquid 6. The solubility is very small in pure water with a pH value of 7. It rises within the alkaline range with increasing pH value.

It is assumed here that the formation of the oxide layer takes place in the case of gallium nitride correspondingly. To produce gallium nitride layers, sapphire may be used as substrate material. When growing gallium nitride on sapphire, the growth process will create many dislocations which start at the sapphire substrate and run upward through the gallium nitride layer to the surface. If the incident UV light 18 creates an electron-hole-pair in the proximity of such a dislocation, the probability is high that the created hole does not reach the surface to contribute to the oxidizing of the semiconductor surface, but that it recombines at the dislocation. Usual etching procedures to etch other semiconductors, e. g. made of gallium arsenide, use a constant illumination, resulting in a constant current density. If this etching procedures are used for gallium nitride grown on a sapphire substrate, etching does not take place in the direct proximity of these dislocations. As these dislocations penetrate the whole layer approximately perpendicularly up to the sapphire substrate, these dislocations may remain standing after the etching process as needle-shaped formations, so called whiskers.

To etch an as large a part of the gallium nitride surface as possible also in the proximity of the dislocations, a much stronger irradiation with UV light 18 is used in the case of gallium nitride. During photo-electro-chemical etching of gallium arsenide the light intensity is adjusted usually in such a way that the generated photo current is in a range from 0,1 to 1,5 mA/cm$^2$. For the procedure for photo-electrochemical etching of gallium nitride, which described here, the light intensity is adjusted, thus that when switching on the light the generated photo current rises steeply from 0 to a comparatively very high value of 5–50 mA/cm$^2$. Using this large light intensity a very large amount of holes are generated, thus saturating the dislocations, and so also material in the proximity of the dislocations may be etched. During this steep increase of the photo current, the gallium nitride semiconductor is oxidized at the surface of the contact area. As the electrolyte liquid 6 has a very low concentration, the electrolyte liquid 6 in the sealing ring 10 becomes impoverished substantially, and the pH value drops toward the value 7 of deionized water. This has the consequence that the oxide layer is dissolved very slowly, and as a consequence the oxide thickens. During this time, the photo-current 1, as shown in FIG. 4, decreases slowly.

From other semiconductors the following is well known (it has been investigated especially for silicon very extensively): Regions of the surface, which extend out of the surface, are oxidizing much faster than flat parts of the of the surface of the semiconductor layer 12. Therefore if a rough surface is oxidized, the oxidation front is flattened compared to the surface. It is assumed here that this occurs also in the case of gallium nitride. Thus the oxidation front in the semiconductor will smooth out any rough inhomogeneities of the semiconductor surface.

If subsequently the light is shut off and a jet of fresh electrolyte is applied to the contact area, the oxide layer will be dissolved very fast. So after the described process cycle, a layer of the semiconductor has been removed successfully, leaving a clean and flat surface. This process cycle thus acts as an etching step and may be repeated to etch deeper into the semiconductor layer 12.

As shown in FIG. 4, after a time T1 of 5 to 20 seconds, typically of 10 seconds, starting from switching on of the irradiation with UV light 18, fresh electrolyte liquid 6 is pumped through the inlet 20 to the contact area 14. For this purpose the pump 22 is switched on for a short period of time, as shown in FIG. 3. The pump 22 is typically switched on only for approximately 0.3 seconds, so that the pressure surges 48 are created. As soon as the fresh electrolyte liquid 6 reaches the contact area 14, the pH value at the contact area rises sharply back to the initial value, and the oxide is dissolved very fast.

During the time when the fresh electrolyte liquid 6 is pumped to the contact area 14, it is favourable to switch off the illumination of the contact area 14 with UV light 18, so that the uniform illumination of the contact area 14 with UV light 18 is not disturbed by turbulences in the electrolyte liquid 6, that may be generated by the fluid jet. This is shown in FIG. 2. While the illumination of the contact area 14 with UV light 18 is switched off, the light current I drops essentially to 0, as shown in FIG. 4. Before switching on the light again, starting from the pump surge 48 of the electrolyte liquid 6 shown in FIG. 3, a waiting period T of 1 to 10 seconds should be waited, typically approximately 2 seconds, so that the turbulences in the electrolyte liquid 6 have ceased. Then the illumination may be switched on again, and the next etching step may take place.

Concerning the etching procedure described here, it is essential that fresh electrolyte liquid 6 can be supplied to the contact area 14 repeatedly, in each case in form of a short pump surge 48. Thus, very strongly diluted electrolyte liquid 6 can be used. Because of this low concentration the pH value in the electrolyte liquid 6 at the contact area 14 decreases with formation of the oxide layer. Thus, when switching on the illumination, the formation of the oxide layer is much more extensive than the chemical dissolution of the oxide. While the oxide layer thickens, the oxidation front smoothes, which prevents whisker formation. By the possibility to provide fresh electrolyte liquid 6 in form of short pump surges 48, this cycle of oxidation and dissolution with a smoothening effect can be repeated, until the desired etching depth is reached. Because of the use of only short pump surges 48, electrolyte liquid 6 is not excessively used.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed is:

1. A method for photo-electrochemically etching a semiconductor sample, comprising the steps of:
    bringing a semiconductor sample in contact with an electrolyte liquid, thereby forming a contact area,
    irradiating the contact area of the semiconductor sample repeatedly through the electrolyte liquid with UV light irradiation for a predetermined time, whereby a waiting time is generated between each of said UV light irradiations, thereby generating a photo current during each of said UV light irradiations,
    measuring the photo current, and
    repeatedly subjecting the contact area to a jet of fresh electrolyte liquid, wherein said jet of fresh electrolyte liquid is applied to said contact area in said waiting time between two of said UV light irradiations.

2. The method of claim 1, wherein the semiconductor sample is made of gallium nitride.

3. The method of claim 1, wherein the predetermined time is between 5 and 20 seconds.

4. The method of claim 1, wherein the predetermined time is 10 seconds.

5. The method of claim 1, wherein the waiting time is in the range between 1 and 10 seconds.

6. The method of claim 1, wherein the jet of fresh electrolyte liquid is applied at the start of the waiting time.

7. The method of claim 1, wherein the jet of fresh electrolyte liquid is created by a pump in form of a pressure surge.

8. The method of claim 1, wherein the semiconductor sample is held replaceable in a vertical position.

9. The method of claim 1, wherein the contact area has a diameter of 1 to 4 mm.

10. The method of claim 1, and further comprising the steps of providing a reference electrode at the semiconductor sample, and applying a voltage of −0.5 V to +0.5 V between the semiconductor sample and the reference electrode.

11. The method of claim 1, wherein the jet of fresh electrolyte liquid is applied for 0.1 to 2.0 seconds to the contact area.

12. The method of claim 1, wherein the electrolyte liquid is an aqueous diluted caustic potash solution (KOH) having a concentration in the range of 0.002M to 0.1M.

* * * * *